(12) United States Patent
Singh et al.

(10) Patent No.: US 10,669,152 B2
(45) Date of Patent: Jun. 2, 2020

(54) DEVICE ARRANGEMENT

(71) Applicant: AGENCY FOR SCIENCE, TECHNOLOGY AND RESEARCH, Singapore (SG)

(72) Inventors: Navab Singh, Singapore (SG); Jae Wung Lee, Singapore (SG); Srinivas Merugu, Singapore (SG)

(73) Assignee: AGENCY FOR SCIENCE, TECHNOLOGY AND RESEARCH, Singapore (SG)

( * ) Notice: Subject to any disclaimer, the term of this patent is extended or adjusted under 35 U.S.C. 154(b) by 97 days.

(21) Appl. No.: 15/768,531

(22) PCT Filed: Oct. 6, 2016

(86) PCT No.: PCT/SG2016/050492
§ 371 (c)(1),
(2) Date: Apr. 13, 2018

(87) PCT Pub. No.: WO2017/065691
PCT Pub. Date: Apr. 20, 2017

(65) Prior Publication Data
US 2018/0312399 A1    Nov. 1, 2018

(30) Foreign Application Priority Data

Oct. 14, 2015    (SG) ..................... 10201508506U

(51) Int. Cl.
*B81C 1/00*  (2006.01)
*B06B 1/06*  (2006.01)
*B81B 7/00*  (2006.01)

(52) U.S. Cl.
CPC ........ *B81C 1/00246* (2013.01); *B06B 1/0666* (2013.01); *B81B 7/008* (2013.01);
(Continued)

(58) Field of Classification Search
CPC ............ B81C 1/00246; B81C 1/00039; B81C 2203/0735; B06B 1/0666; B81B 7/008;
(Continued)

(56) References Cited

U.S. PATENT DOCUMENTS 8,541,850 B2    9/2013 Gupta et al.
2005/0140468 A1    6/2005 Wang
(Continued)

FOREIGN PATENT DOCUMENTS

WO    WO 2007/117198 A1    10/2007
WO    WO 2014/126724 A1    8/2014

OTHER PUBLICATIONS

IP Office of Singapore—Notification of Transmittal of the International Search Report & the Written Opinion of the International Searching Authority, or the Declaration, with the International Search Report & Written Opinion dated Dec. 23, 2016 for International Application No. PCT/SG2016/050492 (11 pgs).
(Continued)

*Primary Examiner* — Hrayr A Sayadian
(74) *Attorney, Agent, or Firm* — Womble Bond Dickinson (US) LLP

(57) ABSTRACT

Various embodiments may provide a device arrangement. The device arrangement may include a substrate including a conductive layer. The device arrangement may further include a microelectromechanical systems (MEMS) device monolithically integrated with the substrate, wherein the MEMS device may be electrically coupled to the conductive layer. A cavity may be defined through the conductive layer for acoustically isolating the MEMS device MEMS device from the substrate. At least one anchor structure may be defined by the conductive layer to support the MEMS device.

20 Claims, 9 Drawing Sheets

(52) U.S. Cl.
CPC .. *B81C 1/00039* (2013.01); *B81B 2201/0271* (2013.01); *B81B 2203/0127* (2013.01); *B81B 2203/0307* (2013.01); *B81B 2203/0315* (2013.01); *B81B 2203/04* (2013.01); *B81B 2207/015* (2013.01); *B81B 2207/07* (2013.01); *B81C 2203/0735* (2013.01)

(58) Field of Classification Search
CPC ...... B81B 2201/027; B81B 2203/0127; B81B 2203/0307; B81B 2203/0315; B81B 2203/04; B81B 2207/015; B81B 2207/07
See application file for complete search history.

(56) References Cited

U.S. PATENT DOCUMENTS

| | | | |
|---|---|---|---|
| 2006/0202779 | A1 | 9/2006 | Fazzio et al. |
| 2007/0265732 | A1 | 11/2007 | Chen |
| 2009/0017305 | A1 | 1/2009 | Dietz et al. |
| 2011/0111545 | A1 | 5/2011 | El-Gamal |
| 2012/0248615 | A1 | 10/2012 | Chien et al. |
| 2012/0261830 | A1 | 10/2012 | Chu et al. |
| 2015/0228694 | A1 | 8/2015 | Brawley |
| 2015/0315016 | A1 | 11/2015 | Yoneoka et al. |

OTHER PUBLICATIONS

IP Office of Singapore—International Preliminary Report on Patentability dated Nov. 9, 2017 for International Application No. PCT/SG2016/050492 (7 pgs).

Viering Jentschura & Partner—Response to Written Opinion under Chapter II Demand including related Article 34 Amendment filed for International Application No. PCT/SG2016/050492 dated Jul. 27, 2017 (11 pgs).

K. E. Wojciechowski, et al., "Single-Chip Precision Oscillators Based on Multi-Frequency, High-Q Aluminum Nitride Mems Resonators," Transducers 2009—2009 International Solid-State Sensors, Actuators and Microsystems Conference, pp. 2126-2130.

Marc-Alexandre Dubois, et al., "Monlithic Above-IC Resonator Technology for Integrated Architectures in Mobile and Wireless Communication," IEEE Journal of Solid-State Circuits, vol. 41, No. 1, pp. 7-16, (Jan. 2006).

Form a substrate including a conductive layer, and a microelectromechanical systems (MEMS) device monolithically integrated with the substrate — 401

DEVICE ARRANGEMENT

CROSS-REFERENCE TO RELATED APPLICATIONS

This patent application is a U.S. National Phase application under 35 U.S.C. § 371 of International Application No. PCT/SG2016/050492, filed on 14 Oct. 2016, entitled DEVICE ARRANGEMENT, which claims the benefit of priority of Singapore Patent Application No. 10201508506U, filed Oct. 14, 2015, the contents of which were incorporated by reference in their entirety for all purposes.

TECHNICAL FIELD

Various aspects of this disclosure relate to device arrangements.

BACKGROUND

Microelectromechanical system (MEMS) devices have achieved a great attention in last decade due to their use in many high volume smart systems, such as smart phones, automobiles, and various biomedical devices and applications. Most of the MEMS devices cannot be used stand alone and need integration with Application Specific Integrated Circuits (ASIC) for driving and/or sensing the MEMS device output.

Integration of MEMS device with electronic circuitry can be divided into three categories:

1) Two dimensional (2D)-Multi-chip Solution: In this type of integration scheme both MEMS and ASIC are fabricated separately on different substrates using dedicated MEMS and IC processes, and then connected by placing MEMS and IC chips side by side during final hybridization. 2D multi-chip solutions may be known as system on board, or system in package (SiP);

2) Vertical Multi-chip solution: In this integration scheme, separately fabricated MEMS and IC devices are integrated vertically either using chip-to-chip, chip-to-wafer or wafer-to-wafer bonding techniques; and 3) Monolithic Integration: In this integration scheme, both the MEMS device and electronic circuitry are fabricated on the same substrate. Monolithic integration may be further split into four sub techniques: a) MEMS first monolithic integration, b) MEMS and IC interlaced processing, c) MEMS last processing with bulk micro-machining, and d) MEMS last processing with surface micromachining.

Each type of the MEMS to ASIC integration has pros and cons. High parasitic and poor connection density are of concern in multichip solutions, while cumulative yield and MEMS device performance could be a concern in monolithic integration, if the monolithic integration is not properly designed. In some cases, such as 2D piezoelectric micromachined ultrasonic transducer (PMUT) arrays for finger printing applications or medical imaging, only monolithic integration is capable to produce required resolution. Other schemes fail to achieve required array density due to large bond pad size requirement, as each transducer in the array need to be controlled by electronics independently.

SUMMARY

Various embodiments may provide a device arrangement. The device arrangement may include a substrate including a conductive layer. The device arrangement may further include a microelectromechanical systems (MEMS) device monolithically integrated with the substrate, wherein the MEMS device may be electrically coupled to the conductive layer. A cavity may be defined through the conductive layer for acoustically isolating the MEMS device from the substrate. At least one anchor structure may be defined by the conductive layer to support the MEMS device.

BRIEF DESCRIPTION OF THE DRAWINGS

The invention will be better understood with reference to the detailed description when considered in conjunction with the non-limiting examples and the accompanying drawings, in which:

FIG. 5 is a schematic illustrating a method of forming a device arrangement according to various embodiments.

DETAILED DESCRIPTION

Figure 1:
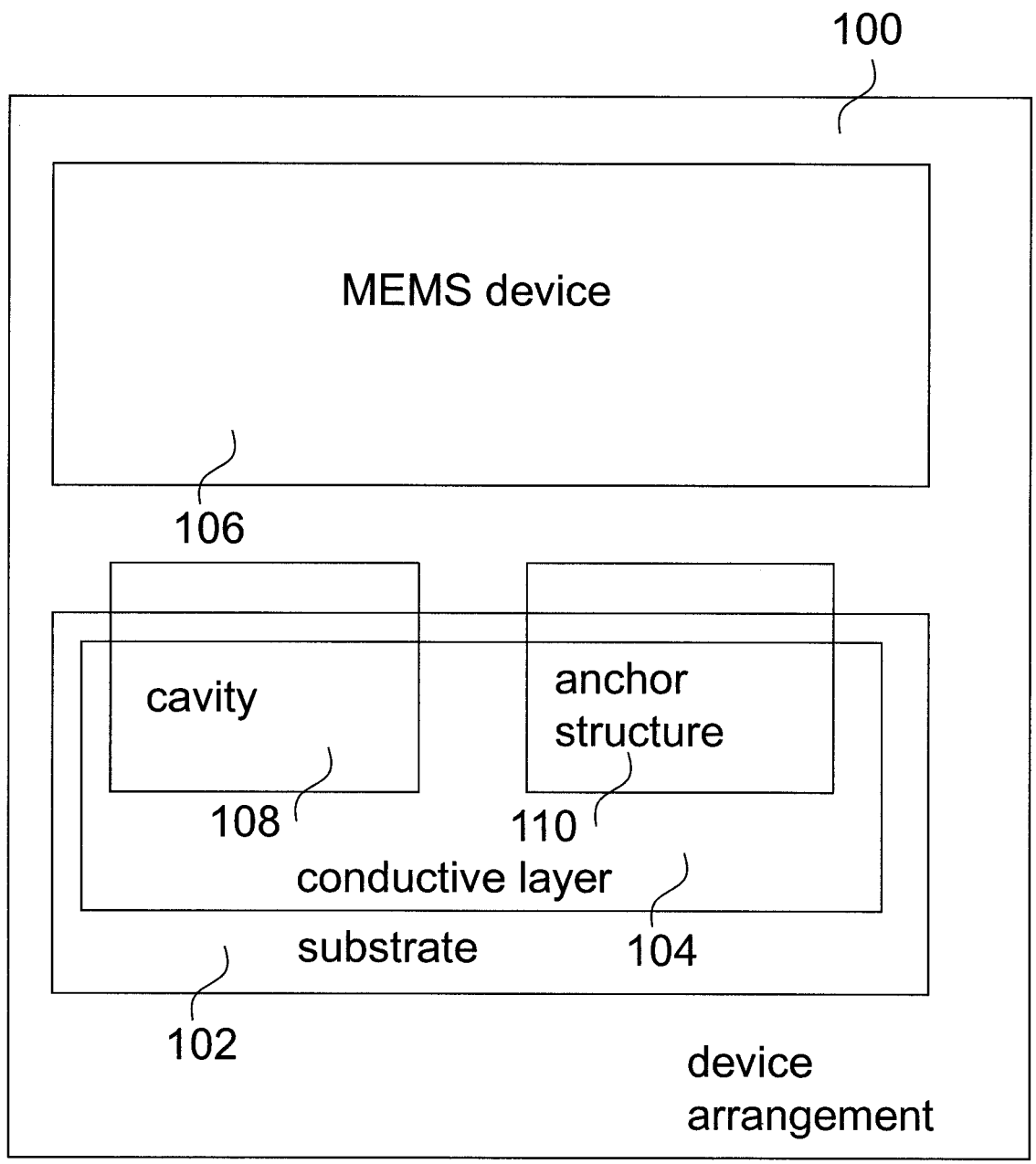
FIG. 1 is a schematic illustrating a device arrangement according to various embodiments.

The following detailed description refers to the accompanying drawings that show, by way of illustration, specific details and embodiments in which the invention may be practiced. These embodiments are described in sufficient detail to enable those skilled in the art to practice the invention. Other embodiments may be utilized and structural, and logical changes may be made without departing from the scope of the invention. The various embodiments are not necessarily mutually exclusive, as some embodiments can be combined with one or more other embodiments to form new embodiments.

Embodiments described in the context of one of the methods or devices are analogously valid for the other methods or devices. Similarly, embodiments described in the context of a method are analogously valid for a device, and vice versa.

Features that are described in the context of an embodiment may correspondingly be applicable to the same or similar features in the other embodiments. Features that are described in the context of an embodiment may correspondingly be applicable to the other embodiments, even if not explicitly described in these other embodiments. Furthermore, additions and/or combinations and/or alternatives as described for a feature in the context of an embodiment may correspondingly be applicable to the same or similar feature in the other embodiments.

The word "over" used with regards to a deposited material formed "over" a side or surface, may be used herein to mean that the deposited material may be formed "directly on", e.g. in direct contact with, the implied side or surface. The word "over" used with regards to a deposited material formed "over" a side or surface, may also be used herein to mean that the deposited material may be formed "indirectly on" the implied side or surface with one or more additional layers being arranged between the implied side or surface and the deposited material. In other words, a first layer "over" a second layer may refer to the first layer directly on the second layer, or that the first layer and the second layer are separated by one or more intervening layers.

The device arrangement as described herein may be operable in various orientations, and thus it should be understood that the terms "top", "bottom", etc., when used in the following description are used for convenience and to aid understanding of relative positions or directions, and not intended to limit the orientation of the device arrangement.

In the context of various embodiments, the articles "a", "an" and "the" as used with regard to a feature or element include a reference to one or more of the features or elements.

In the context of various embodiments, the term "about" or "approximately" as applied to a numeric value encompasses the exact value and a reasonable variance.

As used herein, the term "and/or" includes any and all combinations of one or more of the associated listed items.

Various embodiments seek to address or alleviate some of the abovementioned problems. Various embodiments relate to a device arrangement related to or resulting from MEMS last process.

MEMS last process with surface micromachining may provide true benefit as MEMS may be vertically on top of electronics and therefore that does not occupy any extra space. In all the related prior arts, ASIC wafers are first planarized and then isolated/protected from MEMS device with thick isolation layer. Sacrificial layer pocket are then created over the planarized dielectric for acoustic isolation. Complex techniques are used for connecting MEMS electrodes to IC input/output nodes and also for defining anchors and release etch holes. Generally, for a piezo MEMS transducer, such as acoustic resonator, three metal layers are used to complete post electronic process including interconnection to ASIC. Generally, eight or more masking layers are used in realization of such devices. Various embodiments may reduce the number of masking layers to four. Various embodiments may provide additional advantage of device performance tuning through diaphragm last approach.

FIG. 1 is a schematic illustrating a device arrangement 100 according to various embodiments. The device arrangement 100 may include a substrate 102 including a conductive layer 104. The device arrangement 100 may further include a microelectromechanical systems (MEMS) device 106 monolithically integrated with the substrate 102, wherein the MEMS device 106 may be electrically coupled to the conductive layer 104. A cavity 108 may be defined through the conductive layer 104 for acoustically isolating the MEMS device 106 from the substrate 102. At least one anchor structure 110 may be defined by the conductive layer 104 to support the MEMS device 106.

In other words, a device arrangement 100 may include a substrate 102 with an electrically conductive layer 104. The device arrangement 100 may also include a MEMS device 106 electrically connected to the conductive layer 104. The substrate and the MEMS device may be formed from a single piece of material, not fabricated separately and attached together. The walls of a cavity 108 are defined at least partially using the conductive layer 104. At least a portion of an anchor structure 110 may be formed on the conductive layer 104 to support the MEMS device 106.

FIG. 1 serves as a general schematic and is not intended to be interpreted in a limiting manner. In particular, FIG. 1 serves to highlight the various features of a device arrangement 100 according to various embodiments, and does not necessarily limit the arrangement of the features relative to one another. Further, FIG. 1 does not limit the layout, shapes and sizes of the various features. While FIG. 1 shows the cavity 108 extending outside the conductive layer 104, various embodiments may provide a cavity 108 completely within the conductive layer 104. In other words, the cavity 108 may not extend to other portions of the conductive layer 104 or other portions of the device arrangement 100. Similarly, various embodiments may provide an anchor structure 110 completely within the conductive layer 104. In various embodiments, the anchor structure 110 may not extend to other portions of the conductive layer 104 or other portions of the device arrangement 100.

In various embodiments, the conductive layer 104 may serve several purposes, such as electrically coupling the MEMS device 106, provide an anchor to the MEMS device 106, and providing a cavity 108 for acoustically isolating the MEMS device 106. As various features may be formed on the conductive layer 104, various embodiments may require fewer masking steps, thus simplifying manufacturing process. Various embodiments may provide a more compact device arrangement 100.

The conductive layer 104 may be on or may be embedded in a dielectric layer. A conductive layer 104 may refer to an electrically conductive layer. "Conductive" as used herein may refer to electrically conductive.

In various embodiments, the at least one anchor structure 110 may be configured to support the MEMS device 106. The MEMS device 106 may be on or over the at least one anchor structure. The at least one anchor structure 100 may suspend the MEMS device 106 over a cavity, such as cavity 108. The at least one anchor structure 110 may be or may include a pillar.

In various embodiments, the conductive layer 104 may include a plurality of conductive regions. At least one conductive region of the plurality of conductive regions may define or may be the at least one anchor structure 108. The MEMS device 106 may be electrically coupled to one or more conductive regions of the conductive layer 104.

Electrical coupling used in the present context may refer to electrically connecting. According, a first electrical element electrically coupled to a second electrical element may refer to the first electrical element in electrical connection with the second electrical element.

In various embodiments, the plurality of conductive regions may be spaced apart from each other or one another. The plurality of conductive regions may be electrically isolated from each other or one another. The cavity 108 may be defined in a spacing between two conductive regions of the plurality of conductive regions. The cavity 108 may be defined by two neighbouring conductive regions.

In various embodiments, each conductive region of the plurality of conductive regions may include a tapered conductive region.

In various embodiments, the cavity 108 may be a sealed cavity. In various alternate embodiments, the cavity 108 may be an open cavity. The cavity 108 may be exposed to external environment. In various embodiments, the entire cavity 108 may be defined within the conductive layer 104. In various embodiments, a depth of the cavity 108 may be substantially equal to a thickness of the conductive layer 104. The depth of the cavity 108 may be any value selected from a range of about 1 µm to about 4 µm.

In various embodiments, the device arrangement 100 may further include a channel in fluid communication with the cavity 108. An end of the channel distal to the cavity 108 may be sealed. In other words, the channel may have a first end fluidically connected to the cavity 108, and a second end which may be sealed. The channel may be defined at least partially though the MEMS device 106.

In various embodiments, the device arrangement 100 may further include a diaphragm arranged over the MEMS device 106 for tuning at least one property of the MEMS device 106. The diaphragm may include one or more layers. The diaphragm may include silicon oxide ($SiO_2$), silicon nitride (SiN), silicon carbide (SiC), silicon (Si), aluminum oxide ($Al_2O_3$) or aluminum nitride (AlN).

In various embodiments, the substrate 102 may include a circuit arrangement electrically coupled to the conductive layer 104. The circuit arrangement may be an application specific integrated circuit (ASIC).

The substrate 102 and the conductive layer 104 may be part of a complementary metal-oxide semiconductor (CMOS) device or an ASIC device. The substrate may include one or more transistors. The one or more transistors may be in electrical connection to a conductive region of the conductive layer 104. A transistor may be in electrical connection with a conductive region electrically coupled to the MEMS device 106. The substrate may include at least one n-type transistor, e.g. n-metal oxide semiconductor (NMOS) transistor, and at least one p-type transistor, e.g. p-metal oxide semiconductor (PMOS) transistor. The MEMS device 106 may be monolithically integrated with the CMOS device, or the ASIC device. The substrate may alternatively or additionally include one or more passive devices such as resistors or capacitors. The one or more passive devices may be in electrical connection to a conductive region of the conductive layer 104.

In various embodiments, the conductive layer 106 may be the topmost layer of the substrate 102. In other words, the conductive layer 106 may be the layer nearest the MEMS device. The substrate 102 may further include one or more further conductive layers below the conductive layer 106. The conductive layer 106 may be electrically connected to the one or more further conductive layer via one or more electrical vias. The one or more conductive layers and one or more vias may electrically connect one or more transistors and/or one or more passive devices in the substrate 102 to the conductive layer 106. In various embodiments, the conductive layer 106 may be a conductive layer nearest to the MEMS device. The conductive layer 106 may be a metal layer, such as a copper layer or aluminum layer or a metal alloy layer, such as aluminum alloy. The aluminum alloy layer may be or may include aluminum copper (AlCu) or aluminum silicon copper (AlSiCu).

The MEMS device 106 may include at least one electrode electrically coupled to the conductive layer 104. The device arrangement 100 may also include an electrical via defined at least partially though the MEMS device 106, wherein the at least one electrode is electrically coupled to the conductive layer 104 through the electrical via.

The at least one electrode may include at least one electrical terminal, or at least one bond pad.

The MEMS device 106 may include a first electrode layer including a first electrode portion and a second electrode portion electrically isolated from each other. The MEMS device 106 may also include a second electrode layer electrically coupled to the second electrode portion. The first electrode portion may be electrically coupled to a first conductive region of the plurality of conductive regions. The second electrode portion may be electrically coupled to a second conductive region of the plurality of conductive regions, the second conductive region being electrically isolated from the first conductive region.

The MEMS device 106 may be or may include a piezoelectric MEMS device, such as an aluminum nitride (AlN) or a doped aluminum nitride (AlN), e.g. a scandium aluminum nitride (ScAlN)-based piezoelectric MEMS device. The MEMS device 106 may include a piezoelectric layer. The piezoelectric layer may include AlN, doped MN such as ScAlN. The device arrangement 100 may be or may include a piezoelectric micro-machined ultrasonic transducer (PMUT). The MEMS device 106 may be a transducer, such as a PMUT. The MEMS device 106 may additionally or alternatively include a resonator, such as bulk acoustic wave resonator or a lamb-wave resonator.

Various embodiments may provide a simple and cost effective solution to design and monolithically integrate a piezoelectric MEMS device 106 over electronic circuitry. In various embodiments, the top metal layer of CMOS device or ASIC device may be used to define the acoustic isolation boundaries and/or MEMS anchor 110. The thickness of the conductive layer 104 may be adjusted to meet the depth of the cavity 108. In various embodiments, the depth of the cavity 108 may be selected from a range of about 1 µm to about 4 µm. By using the conductive layer 104 for multiple functions such as bond pads, metal traces, passive components, MEMS anchors, and/or acoustic cavities, unwanted planarization of the CMOS wafer may be eliminated or reduced before start of MEMS fabrication. Further, a lithographic step for defining the anchor 110 may also be removed or eliminated, as the anchor 110 may already be defined by the CMOS bond pad (top metal) mask.

In various embodiments, the substrate 102 may include a suitable semiconductor such as silicon or silicon-germanium: The single piece of material from which the substrate 102 and the MEMS device 106 are formed from may be a suitable semiconductor such as silicon or silicon-germanium.

In various embodiments, four different functions may be realized using second metal layers of the MEMS device. The functions may be (1) forming of top electrode, (2) connecting top electrode to ASIC nodes, (3) connecting bottom electrodes to ASIC nodes, and (4) forming of laterally arranged opened narrow channels for sacrificial release of sacrificial material. Such arrangement of laterally opened narrow channel may allow for subsequent easy sealing. Indeed, such channels may be sealed by deposition and etch back, which may mean no loading on membrane in the sealing process. An additional advantage may be that a thick dielectric layer or stack of layers may be used as a membrane of the MEMS device, which can be used for device tunings e.g. device stress, thermal compensation and frequency tuning etc.

Figure 2A:
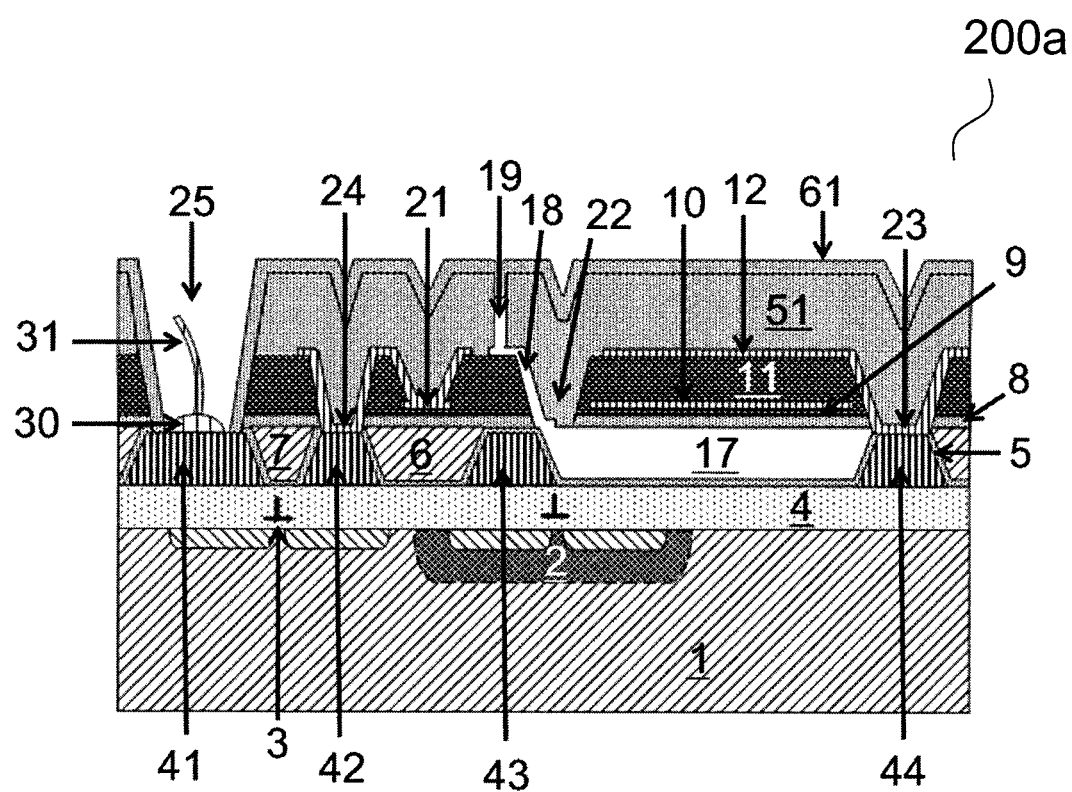
FIG. 2A is a schematic illustrating a device arrangement according to various embodiments.

FIG. 2A is a schematic illustrating a device arrangement 200a according to various embodiments. The device arrangement 200a may be a monolithic system including a substrate 1 with transistors 2, 3, which are complementary to each other to form a CMOS pair. In other words, if transistor 2 is a n-type metal oxide semiconductor (NMOS) transistor, transistor 3 may be a p-type may be a p-type metal oxide semiconductor (PMOS) transistor. The substrate 1 may include one or more NMOS transistors, and one or more PMOS transistors. In various embodiments, a substrate 1 may include millions or billions of such transistors 2, 3. The transistors may be interconnected to one another via conductive layers e.g. metal lines, in the dielectric layer 4 over the substrate. The transistors 2, 3 may be interconnected to one another via the conductive layers in different ways depending on the application. The conductive layers and the transistors may form an ASIC circuit. For the sake of clarity, most of the conductive layers are not drawn in FIG. 2. The topmost conductive layer, i.e. the conductive layer (of the CMOS device or ASIC) furthest from the substrate 1, may be or may include Al or an Al alloy such as AlCu or AlSiCu. The topmost conductive layer may be used as traces and/or forming wire bonding pads for connecting integrated circuits to the external environment.

According to various embodiments, the topmost conductive layer may be used for multiple functions. The topmost conductive layer may include for example, CMOS wire bond pad 41, MEMS bottom metal via lending through top metal 42, MEMS device anchor 43, MEMS top metal via lending 44 and/or may be used to define boundaries of the acoustic isolation cavity 17. A first conductive portion 41 of the topmost conductive layer may be used as a bond pad. A second conductive portion 42 of the topmost conductive layer may be used to connect to a bottom conductive terminal of the overlying MEMS device. A third conductive portion 43 may be the anchor for the MEMS device. The third conductive portion 43 and a fourth conductive portion 44 may define an acoustic isolation cavity 17. The portion of the topmost conductive layer between the third conductive portion 43 and the fourth conductive portion 44 may be removed to form cavity 17. The fourth conductive portion 44 of the topmost conductive layer may be used to connect to a top conductive terminal of the overlying MEMS device. In addition, the topmost conductive layer may be used to define one or more passive devices such as one or more capacitors and/or one or more inductors. The thickness of the topmost conductive layer may be adjusted to between about 1 μm to about 4 μm to meet the depth requirements of the isolation cavity 17. In various embodiments, the depth of the cavity 17 may be defined or may be limited by the thickness of the topmost conductive layer. However, in various embodiments, the underlying dielectric layer 4 may be partially or fully etched to increase the depth of the cavity.

Defining the MEMS anchor 43 and the boundaries of acoustic isolation cavity 17 using the topmost conductive layer may help reduce process complexity and/or the number of masking layers in the integrated MEMS device fabrication process. The anchor 43 may mechanically hold the MEMS device. The acoustic isolation cavity 17 may provide a high impedance path for the acoustic waves generated by the MEMS device. The high impedance path may reduce, minimize or eliminate leakage of the acoustic energy towards the ASIC substrate 1. The position of the anchor 43 may define the size of the MEMS device membrane, and therefore the resonance frequency of the MEMS transducer. Accordingly, the precise positioning of the anchor may be important.

After patterning the topmost conductive layer of the CMOS device or ASIC, a thin dielectric layer 5, including a material such as silicon oxide ($SiO_2$), silicon nitride (SiN), silicon carbide (SiC), aluminum oxide ($Al_2O_3$) or aluminum nitride (AlN), may be formed for electrical isolation. A sacrificial material, e.g. amorphous silicon or silicon dioxide may also be deposited to form a sacrificial layer and subsequently planarized. The sacrificial layer thickness may be slightly more than the cavity depth. The planarization of the sacrificial layer may isolate or compartmentalize different portions of the planarized sacrificial layer such that a first portion of the planarized sacrificial layer inside cavity 17 (shown after sacrificial release) may be disconnected to other portions of the planarized sacrificial layer such as the portions in regions 6 and 7. However, in various embodiments, regions 6 and 7 may be connected to each other laterally through layout of the device. The disconnection of the portion of the planarized sacrificial layer in cavity 17 with other portions of the planarized sacrificial layer may be needed so that during sacrificial etch for creating acoustic isolation, the etchant may remain contained inside the cavity 17 and thus the device remains anchored to the device anchor 43. The regions 6 and 7 of the fabricated device arrangement may include the sacrificial material.

One or more MEMS piezoelectric devices, such as ultrasound transducer or bulk acoustic wave resonator, or lambwave resonator, may be then arranged or formed over the acoustic isolation cavity 17. A dielectric material (such as $SiO_2$, SiN, $Al_2O_3$, or AlN) may be first deposited to form thin dielectric layer 8 for protection of the bottom electrode 10 of the MEMS device. A seed material (e.g. AlN) may be deposited to form a seed layer 9 for improving the crystalline quality and/or adhesion of the bottom electrode 10 to the underlying dielectric layer 8. The seed layer 9 may be in the range of about 15 nm to about 100 nm. Bottom electrode 10 (such as Mo, thickness range from 50 nm to 500 nm) is then deposited and patterned and piezoelectric layer 11 is deposited. The piezoelectric layer 11 may include or may be MN or doped AlN, such as ScAlN. The piezoelectric layer 11 may be of a thickness in the range of about 100 nm to about 4000 nm.

The piezoelectric layer 11 may be then patterned for defining via 21 to MEMS bottom metal electrode 10, via 24 to CMOS node 42 (MEMS bottom electrode connection to ASIC), sacrificial release hole 22, via 23 to CMOS node 44 (MEMS top electrode connection to ASIC), and opening CMOS pad 25. MEMS top electrode 12 may then be formed. The electrode 12 may be formed by depositing a material such as molybdenum (Mo), with a thickness in the range of about 50 nm to about 500 nm, and patterning the deposited material. A narrow channel 18 may be formed or arranged such that one end of the channel 18 connects to the cavity 17 and the other end of the channel 18 connects to pattern 19 that provides path for sacrificial release.

Dielectric layers 51 and 61 (including materials such as $SiO_2$, or SiN, SiC, or $Al_2O_3$ or AlN; thickness range from few nm to few μm) together may constitute a diaphragm or membrane on top of the MEMS device. In some cases, the diaphragm may function as a temperature compensation layer, a loading layer for resonance frequency tuning or a stress tuning layer or to shape the MEMS device. In some other cases, the diaphragm may be even more important such as the case of a receiving mode pMUT, where the diaphragm functions to pull the neutral plane outside of piezoelectric layer for creating bending moment (functionality requirements). In various embodiments, a narrow channel 18 may provide easy sealing of the cavity, it would be possible to optimize thickness and properties of membrane layers 51 and 61 for improving device performance rather than merely sealing the cavity. A solder ball 30 may be placed or formed on the ASIC bond pad 41. The solder balls may be connected to external environment using wire 31 through wire bonding or even through flip chip bonding.

Figure 2B:
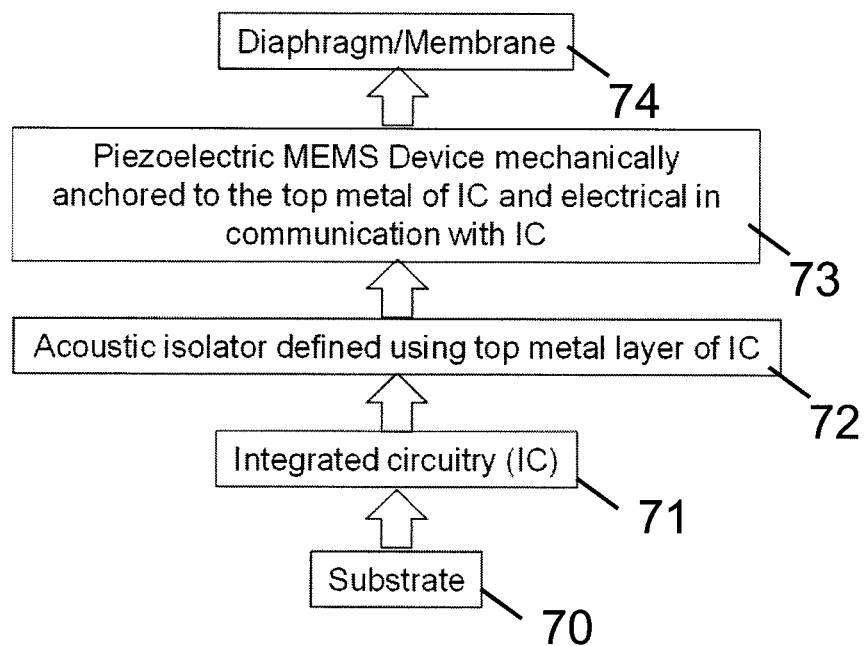
FIG. 2B is a block diagram illustrating a device arrangement according to various embodiments.

FIG. 2B is a block diagram illustrating a device arrangement 200b according to various embodiments. FIG. 2B may be seen as a more general representation of the device arrangement shown in FIG. 2A. The device arrangement 200b may be referred to as a platform.

The platform may include a substrate 70, which may be denoted as 1 in FIG. 2A. The platform may further include integrated circuitry 71 at a top portion of the substrate 70. The integrated circuitry 71 may include transistors 2, 3 and conductive layer in FIG. 2A. The platform also includes an acoustic isolator 72 over the integrated circuitry. The acoustic isolator 72 may be cavity 17 shown in FIG. 2A. The acoustic isolation cavity 17 may be defined by the top metal portions 43, 44 of the integrated circuit. A narrow channel 18 in fluidic connection with the cavity 17 at one end may be sealed at the other end. The platform may further include piezoelectric MEMS device 73 mechanically anchored to the top metal portion 43 of the integrated circuit, and may be in electrical communication with the integrated circuit. The MEMS anchor may also be defined using the top metal portion 43 of the integrated circuit. The MEMS device 73 may include piezoelectric layer 11 and electrode layers 10, 12. The MEMS device electrodes 10, 12 may be in electrical communication with integrated circuit. The MEMS device 73 also includes conductive layers 21, 23, 24 to electrically connect the electrode layers 10 or 12 to top metal portions 42 or 44. One or more electrodes may be in electric connection with the integrated circuit through top conductive layers present in the MEMs. The platform may additionally include diaphragm or membrane 74 over the MEMS device 72. The diaphragm or membrane 74 may include dielectric layers 51, 61. The diaphragm or membrane 74 may be used to seal the cavity. The diaphragm or membrane 74 may also be used to tune the property of the device by moving the neutral axis away from the piezoelectric layer.

Figure 2C:
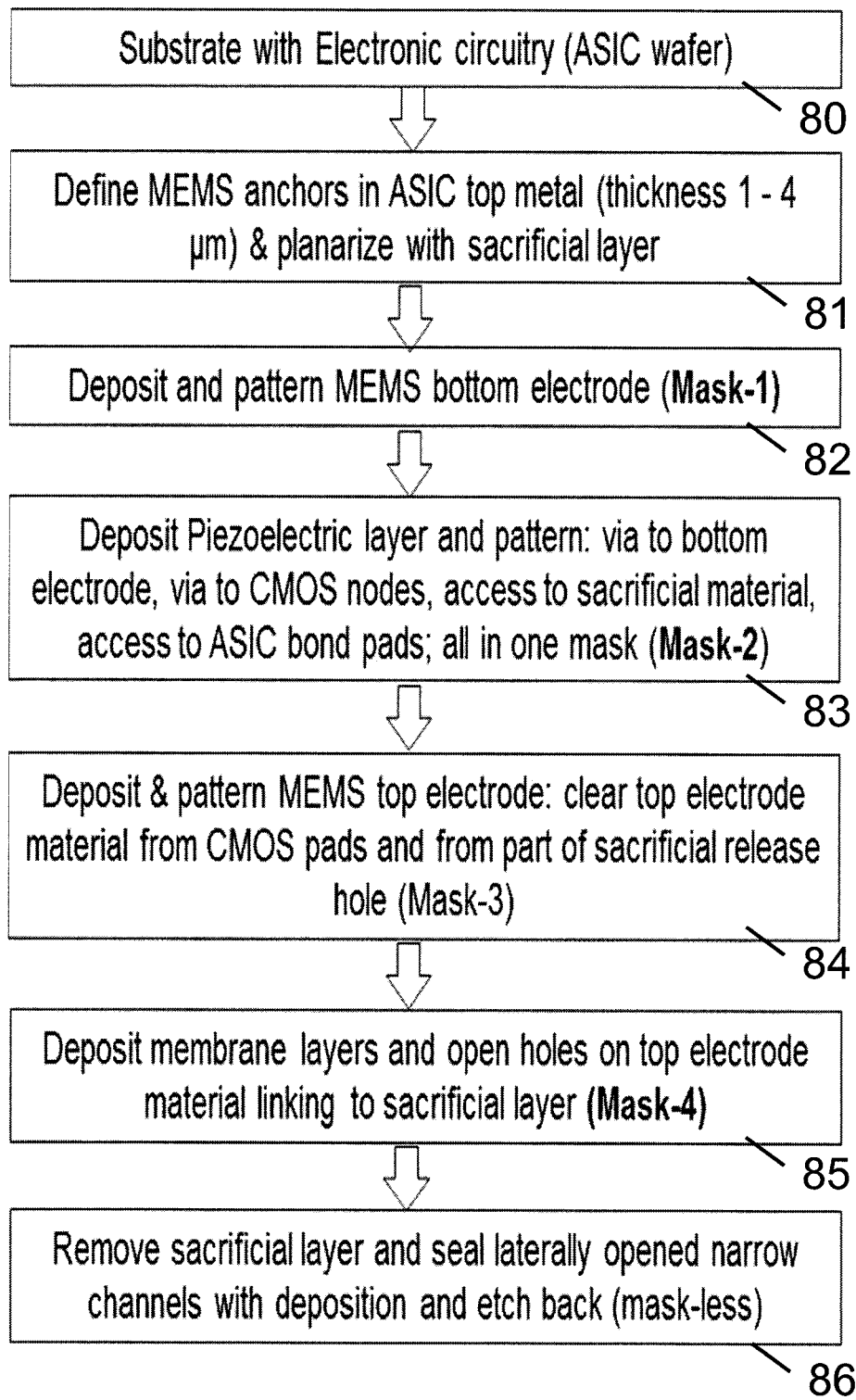
FIG. 2C is a flow diagram of forming a device arrangement according to various embodiments.

FIG. 2C is a flow diagram 200c of forming a device arrangement according to various embodiments. The method may include, in 80, providing an ASIC wafer. The method may also include, in 81, defining MEMS anchors in ASIC top metal and planarizing the sacrificial layer. The method may include, in 82, depositing and patterning MEMs bottom electrode using a first mask (Mask-1). The method may include in 83, depositing or forming the piezoelectric layer and patterns such as a via to bottom electrode, a via to CMOS nodes, access to sacrificial material, access to ASIC bond pads in a single second mask (Mask-2). The method may also include, in 84, depositing and patterning a MEMS top electrode including clearing top electrode material from CMOS pad and forming part of a sacrificial release hole in a third mask (Mask-3). The method may additionally include, in 85, depositing or forming membrane layers and opening holes on top electrode material linking to sacrificial layer in a fourth mask (Mask-4). The method may also include, in 86, removing sacrificial layer and sealing laterally opened narrow channels with deposition and etch back, which may be a mask-less step. Alternatively or additionally, instead of using etch back, the layer that is used for sealing the narrow channels may be patterned and etched to open the bond pads.

Figure 3A:
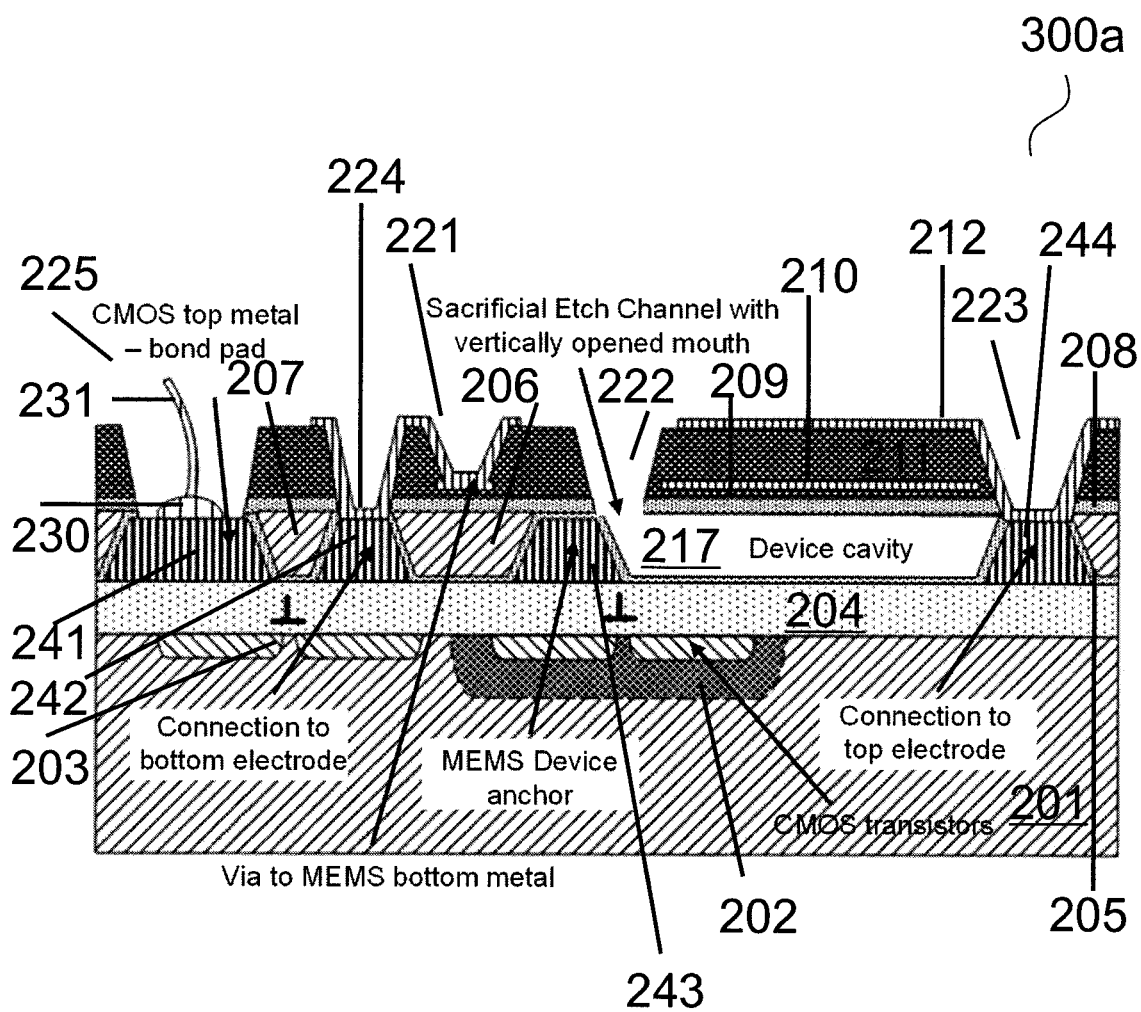
FIG. 3A is a schematic illustrating a device arrangement according to various embodiments.

FIG. 3A is a schematic illustrating a device arrangement 300a according to various embodiments. The device arrangement 300a may include a substrate 201 with transistors 202, 203 formed on the substrate. The transistors 202, 203 may form a complementary pair. The substrate may also include a dielectric layer 204 over the transistors 202, 203. An electrically conductive layer may be formed on or may be embedded in the dielectric layer 204. The electrically conductive layer may be in electrical connection with the transistors 202, 203. The electrically conductive layer may include portions 241, 242, 243, 244. There may be one or more further electrically conductive layers and/or one or more further dielectric layers between the substrate 201 and the electrically conductive layer. The electrically conductive layer may be a metal layer including a suitable metal such as aluminum or a metal alloy such as AlCu or AlSiCu. The electrically conductive layer may be the topmost layer of the substrate 201. Portion 241 may be used as a wire bond pad, portion 242 may be used to connect to a bottom conductive terminal of the overlying MEMS device. Portion 243 may be used as a MEMS device anchor. Portion 244 may be used to connect to a top conductive terminal of the overlying MEMS device. In various embodiments, one or more further portions of the electrically conductive layer may be or may be used as a passive device such as an inductor or a capacitor. A cavity 217 for acoustic isolation of the MEMS device may be formed by removing a portion of the electrically conductive layer between portions 243, 244. The device arrangement 300a may further include a dielectric layer 205 on the patterned electrically conductive layer for electrical isolation. A sacrificial material may also be deposited over the patterned electrically conductive layer and planarized to form regions 206, 207. The cavity 217 may also include the sacrificial material. The sacrificial material within cavity 217 may be isolated from regions 206, 207, so that an etchant introduced subsequently to cavity 217 to etch the sacrificial material within 217 may be contained within cavity 217.

A MEMS device such as a piezoelectric device may be formed over the cavity 217. A dielectric layer 208 may be deposited for protection of bottom electrodes 210. A seed layer 209 may be formed on the dielectric layer 208 to improve quality and/or adhesion of subsequent electrode layer to the underlying dielectric layer 208. A bottom electrode layer 210 may be formed on or over the seed layer 209. A piezoelectric layer 211 may be formed on or over the bottom electrode layer 210. The piezoelectric layer 211 may include AlN, or doped AlN such as ScAlN. The piezoelectric layer 211 may be patterned to define via 221 so that the bottom electrode layer 210 is exposed at the bottom of via 221. The piezoelectric layer 211 may also be patterned to form via 224 to expose underlying electrically conductive portion 242. In addition, the piezoelectric layer 211 may be patterned to form sacrificial release hole 222 to expose the sacrificial material in cavity 217, and via 223 to expose underlying electrically conductive portion 244. Further, the piezoelectric layer 211 may be patterned to expose underlying electrically conductive portion 241 for opening CMOS pad 225. Portions of the dielectric layer 208, seed layer 209, the bottom electrode layer 210 under the portions of the piezoelectric layer 211 removed may also be patterned. A suitable etchant may be introduced to sacrificial release hole 222 to remove the sacrificial material in cavity 217.

A top electrode layer 212 may be formed over the piezoelectric layer 211. A solder ball 230 may be formed on bond pad 241. An electrically conductive wire 231 may be used to connect solder ball 230 to the external environment.

The device arrangement 300a may differ from the device arrangement 200a in that the device arrangement 300a does not have a diaphragm and the cavity 217 is exposed and not sealed.

Figure 3B:
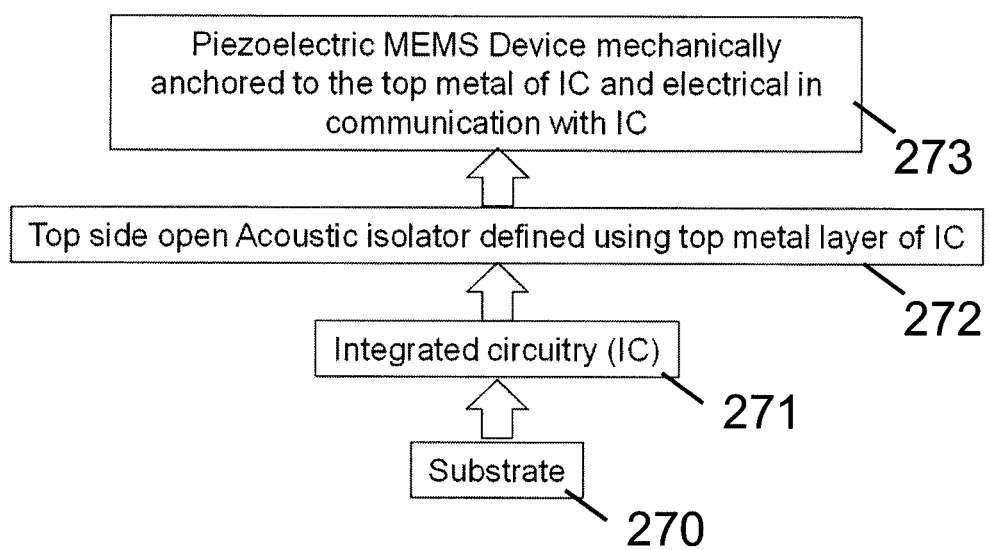
FIG. 3B is a block diagram illustrating a device arrangement according to various embodiments.

FIG. 3B is a block diagram illustrating a device arrangement 300b according to various embodiments. FIG. 3B may be seen as a more general representation of the device arrangement shown in FIG. 3A. The device arrangement 300b may be referred to as a platform.

The platform may include a substrate 270, which may be denoted as 201 in FIG. 3A. The platform may further include integrated circuitry 271 at a top portion of the substrate 270. The integrated circuitry 271 may include transistors 202, 203 and conductive layer 204 in FIG. 2A. The platform also includes an acoustic isolator 272 over the integrated circuitry 271. The acoustic isolator 272 may be cavity 217 shown in FIG. 3A. The acoustic isolation cavity 217 may be defined by the top metal portions 243, 244 of the integrated circuit. The cavity 217 may be exposed to the external environment. The platform may further include piezoelectric MEMS device 273 mechanically anchored to the top metal portion 243 of the integrated circuit and may be in electrical communication with the integrated circuit. The MEMS anchor may also be defined using the top metal portion 243 of the integrated circuit. The MEMS device 273 may include piezoelectric layer 211 and electrode layers 210, 212, 221, 223, 224. The MEMS device electrodes 210, 212, 221, 223, 224 may be in electrical communication with integrated circuit. One or more electrodes may be in electric connection with the integrated circuit through top conductive layers present in the MEMs.

Figure 4:
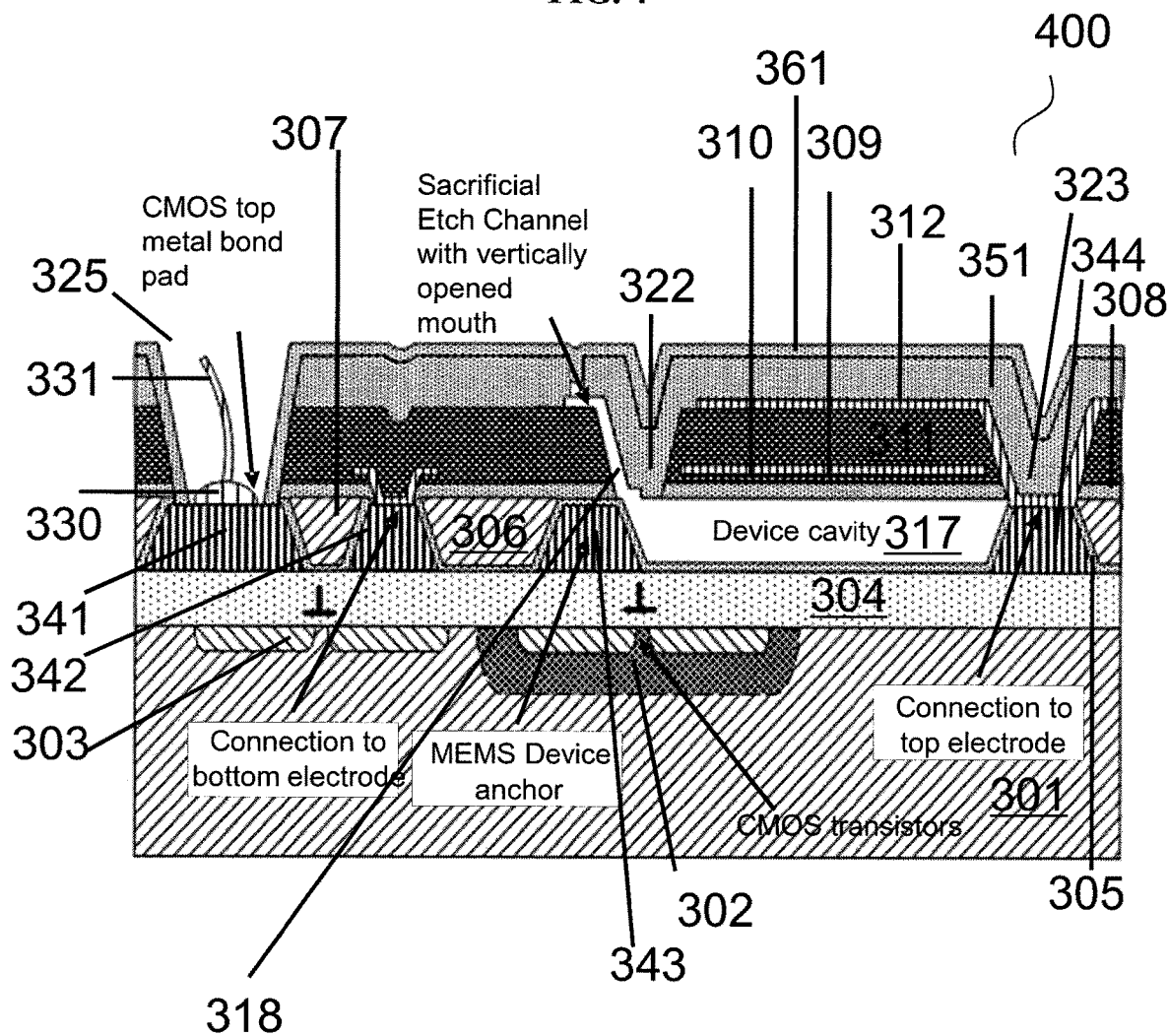
FIG. 4 is a schematic illustrating a device arrangement according to various embodiments.

FIG. 4 is a schematic illustrating a device arrangement 400 according to various embodiments. The device arrangement 400 may include a substrate 301 with transistors 302, 303 formed on the substrate. The transistors 302, 303 may form a complementary pair. The substrate may also include a dielectric layer 304 over the transistors 302, 303. An electrically conductive layer may be formed on or may be embedded in the dielectric layer 304. The electrically conductive layer may be in electrical connection with the transistors 302, 303. The electrically conductive layer may include portions 341, 342, 343, 344. There may be one or more further electrically conductive layers and/or one or more further dielectric layers between the substrate 301 and the electrically conductive layer. The electrically conductive layer may be a metal layer including a suitable metal such as aluminum or a metal alloy such as AlCu or AlSiCu. The electrically conductive layer may be the topmost layer of the substrate 301. Portion 341 may be used as a wire bond pad, portion 342 may be used to connect to a bottom conductive terminal of the overlying MEMS device. Portion 343 may be used as a MEMS device anchor. Portion 344 may be used to connect to a top conductive terminal of the overlying MEMS device. In various embodiments, one or more further portions of the electrically conductive layer may be or may be used as a passive device such as an inductor or a capacitor. A cavity 317 for acoustic isolation of the MEMS device may be formed by removing a portion of the electrically conductive layer between portions 343, 344. The device arrangement 400 may further include a dielectric layer 305 on the patterned electrically conductive layer for electrical isolation. A sacrificial material may also be deposited over the patterned electrically conductive layer and planarized to form regions 306, 307. The cavity 317 may also include the sacrificial material. The sacrificial material within cavity 317 may be isolated from regions 306, 307, so that an etchant introduced subsequently to cavity 317 to etch the sacrificial material within 317 may be contained within cavity 317.

A MEMS device such as a piezoelectric device may be formed over the cavity 317. A dielectric layer 308 may be deposited for protection of bottom electrodes 310. A seed layer 309 may be formed on the dielectric layer 308 to improve quality and/or adhesion of subsequent electrode layer to the underlying dielectric layer 308. A bottom electrode layer 310 may be formed on or over the seed layer 309. The portion of the dielectric layer 308 over the electrically conductive portion 342 may be removed to expose the electrically conductive portion 342 before forming the seed layer 306 and the bottom electrode layer 310 so that the seed layer 306 and the bottom electrode layer 310 may be in electrical connection with the electrically conductive portion 342. A piezoelectric layer 311 may be formed on or over the bottom electrode layer 310. The piezoelectric layer 311 may include MN, or doped AlN such as ScAlN. The piezoelectric layer 311 may be patterned to form sacrificial release hole 322 to expose the sacrificial material in cavity 317, and via 323 to expose underlying electrically conductive portion 344. Further, the piezoelectric layer 311 may be patterned to expose underlying electrically conductive portion 341 for forming CMOS pad 325. Portions of the dielectric layer 308, seed layer 309, the bottom electrode layer 310 under the portions of the piezoelectric layer 311 removed may also be patterned. A channel 318 may be formed such that one end connects to the cavity. A suitable etchant may be introduced to the channel 318 to remove the sacrificial material in the cavity 317.

A top electrode layer 312 may be formed over the piezoelectric layer 311. A first dielectric layer 351 may be formed over the MEMS device. A second dielectric layer 361 may be formed on or over dielectric layer 351. Another end of the channel 318 distal from the cavity may be sealed by the dielectric layer 351. The dielectric layers 351, 361 may form a diaphragm or membrane for moving the neutral axis away from the piezoelectric layer. A solder ball 330 may be formed on bond pad 341. An electrically conductive wire 331 may be used to connect solder ball 330 to the external environment.

The MEMS device may be in electrical connection with the integrated circuit via independent via connections 342, 344.

Various embodiments may provide a monolithic piezoelectric MEMS on CMOS technology platform. The platform may include a semiconductor substrate, electronic circuitry including at least one transistor structure supported by the substrate. The platform may also include at least one contact to a top metal layer. The top metal layer may be part of the electronic circuitry. The platform may also include an acoustic isolator defined by the top metal layer. The platform may additionally include a piezoelectric MEMS device over or on top of the acoustic isolator such that the MEMS device is mechanically anchored to the top metal layer, and may be electrically in communication with the electronic circuitry. In various embodiments, a top electrode of the MEMS device may electrically connected to the electronic circuitry. The technology platform may additionally include a diaphragm or membrane over or on top of the MEMS device. The diaphragm may be used to tune a property of the MEMS device. In various embodiments, the acoustic isolation cavity may be a sealed cavity. In various other embodiments, the acoustic isolation cavity may be exposed or open. In various embodiments, independent via connections may provide electrical connections between MEMS electrodes and ASIC electrodes.

Various embodiments may provide a monolithic device arrangement. The device arrangement may include a CMOS device including a conductive layer. The device arrangement may also include a MEMS device monolithically integrated with the CMOS device. The MEMS device may be acoustically isolated from the CMOS device using a cavity below the MEMS device, i.e. between the MEMS device and the CMOS device. A conductive layer of the CMOS device may be patterned to define the cavity and one or more anchors of the MEMS device. The MEMS may be electrically coupled to the CMOS device via the conductive layer. The arrangement may further include a diaphragm arranged over the MEMS device. In various embodiments, the patterned conductive layer may include a plurality of tapered conductive regions. In various embodiments, the MEMS device may be or may include a piezoelectric MEMS device. In various embodiments, the bottom electrodes of the piezoelectric MEMS device may be electrically coupled to the conductive layer through a top conductive layer of the MEMS device. In various embodiments, the device arrangement may further include a channel defined at least partially through the MEMS device. The channel may be in fluidic communication with the cavity. In various embodiments, an end of the channel distal to the cavity may be sealed. In various embodiments, the cavity may be defined entirely within the conductive layer. In various embodiments, the MEMS device may be monolithically vertically integrated with the CMOS device.

In various embodiments, a method of forming a device arrangement may be provided. FIG. 5 is a schematic 500 illustrating a method of forming a device arrangement according to various embodiments. The method may include, in 401, providing or forming a substrate including a conductive layer, and a microelectromechanical systems (MEMS) device monolithically integrated with the substrate. The MEMS device may be electrically coupled to the conductive layer. A cavity may be defined through the conductive layer for acoustically isolating the MEMS device from the substrate. At least one anchor structure may be defined by the conductive layer to support the MEMS device.

In other words, the method may include forming a substrate including a conductive layer and a MEMS device from a single piece of material. The MEMS device may be formed such that it is in electrical communication with the conductive layer of the substrate. The conductive layer may also be patterned to define a cavity as well as at least one anchor structure.

Figure 6A:
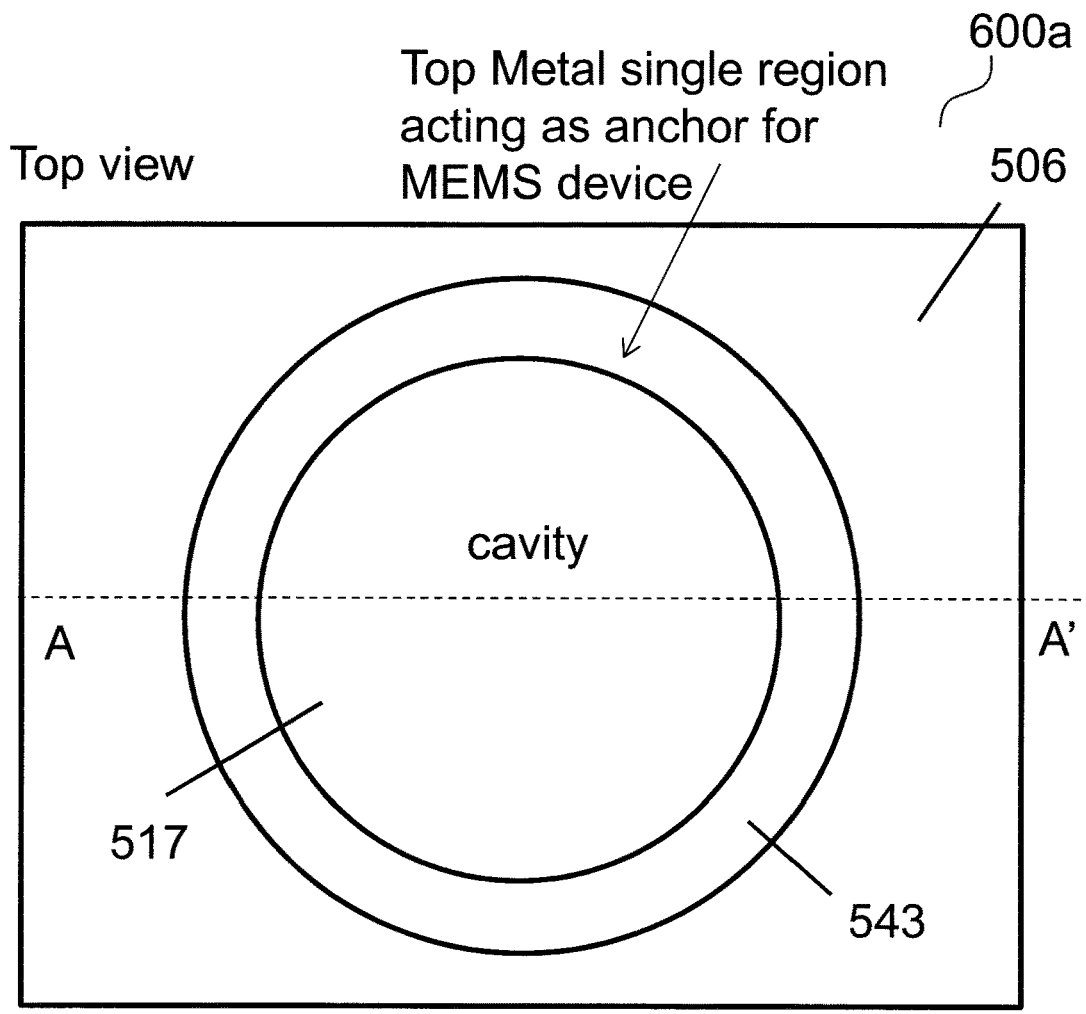
FIG. 6A is a top planar view of a portion of a device arrangement including a cavity according to various embodiments.
Figure 6B:
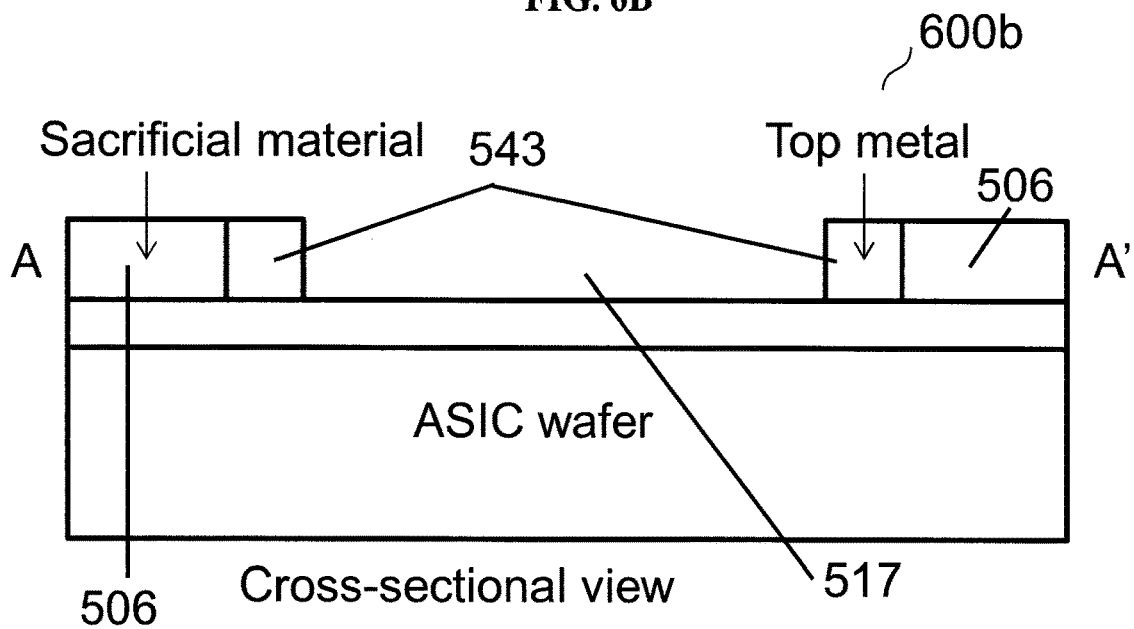
FIG. 6B is a cross-sectional side view of the portion of the device arrangement shown in FIG. 6A according to various embodiments.

FIG. 6A is a top planar view 600a of a portion of a device arrangement including a cavity 517 according to various embodiments. FIG. 6B is a cross-sectional side view 600b of the portion of the device arrangement shown in FIG. 6A according to various embodiments. As shown in FIGS. 6A and 6B, a cavity 517 may be defined through the conductive layer 543. In various embodiments, two of more of the plurality of the conductive regions may be joined to form a continuous conductive region 543. The cavity 517 shown in FIGS. 6A, 6B is circular in shape. However, it may also be envisioned that the cavity 517 may be square or rectangular in shape, or may have any other shapes. The continuous conductive region 543 may surround the cavity on all sides. The continuous conductive region 543 may be circular, square, or rectangular in shape, with the cavity 517 at the center. The continuous conductive region 543 may define the cavity 517, and may also anchor the MEMS device. The sacrificial layer 506 may adjoin the outer perimeter of the continuous conductive region 543.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. A device arrangement comprising:
a substrate comprising a conductive layer; and
a microelectromechanical systems (MEMS) device monolithically integrated with the substrate, wherein the MEMS device is electrically coupled to the conductive layer,
wherein a cavity is defined through the conductive layer for acoustically isolating the MEMS device from the substrate,
wherein a depth of the cavity is equal to a thickness of the conductive layer;
wherein the depth of the cavity is a value selected from a range of 1 μm to 4 μm; and
wherein at least one anchor structure is defined by the conductive layer to support the MEMS device so that the MEMS device is on the at least one anchor structure and over the cavity.

2. The device arrangement of claim 1,
wherein the conductive layer comprises a plurality of conductive regions, and wherein at least one conductive region of the plurality of conductive regions defines the at least one anchor structure.

3. The device arrangement of claim 2,
wherein the plurality of conductive regions are spaced apart from each other, and
wherein the cavity is defined in a spacing between two conductive regions of the plurality of conductive regions.

4. The device arrangement of claim 2,
wherein each conductive region of the plurality of conductive regions comprises a tapered conductive region.

5. The device arrangement of claim 1,
wherein the cavity is a sealed cavity.

6. The device arrangement of claim 1,
wherein the cavity is exposed to external environment.

7. The device arrangement of claim 1,
wherein the entire cavity is defined within the conductive layer.

8. The device arrangement of claim 1, further comprising:
a channel in fluid communication with the cavity.

9. The device arrangement of claim 8,
wherein an end of the channel opposite to the cavity is sealed.

10. The device arrangement of claim 8,
wherein the channel is defined at least partially though the MEMS device.

11. The device arrangement of claim 1, further comprising:
a diaphragm arranged over the MEMS device for tuning at least one property of the MEMS device.

12. The device arrangement of claim 1,
wherein the substrate comprises a circuit arrangement electrically coupled to the conductive layer.

13. The device arrangement of claim 1,
wherein the substrate and the conductive layer are part of a complementary metal-oxide semiconductor (CMOS) device, and wherein the MEMS device is monolithically integrated with the CMOS device.

14. The device arrangement of claim 1,
wherein the conductive layer is the topmost layer of the substrate.

15. The device arrangement of claim 1,
wherein the conductive layer is a metal layer.

16. The device arrangement of claim 1,
wherein the MEMS device comprises at least one electrode electrically coupled to the conductive layer.

17. The device arrangement of claim 16, further comprising:
- an electrical via defined at least partially though the MEMS device, wherein the at least one electrode is electrically coupled to the conductive layer through the electrical via.

18. The device arrangement of claim 2,
wherein the MEMS device comprises:
- a first electrode layer comprising a first electrode portion and a second electrode portion electrically isolated from each other; and
- a second electrode layer electrically coupled to the second electrode portion, wherein the first electrode portion is electrically coupled to a first conductive region of the plurality of conductive regions, and wherein the second electrode portion is electrically coupled to a second conductive region of the plurality of conductive regions, the second conductive region being electrically isolated from the first conductive region.

19. The device arrangement of claim 1,
wherein the MEMS device comprises a piezoelectric MEMS device.

20. The device arrangement of claim 1,
wherein the device arrangement comprises a piezoelectric micro-machined ultrasonic transducer (PMUT).

* * * * *